United States Patent
Afzalian

(10) Patent No.: US 9,818,744 B2
(45) Date of Patent: Nov. 14, 2017

(54) LEAKAGE CURRENT SUPPRESSION METHODS AND RELATED STRUCTURES

(71) Applicant: TAIWAN SEMICONDUCTOR MANUFACTURING COMPANY, LTD., Hsin-Chu (TW)

(72) Inventor: Aryan Afzalian, Chastre (BE)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/477,491

(22) Filed: Sep. 4, 2014

(65) Prior Publication Data

US 2016/0071965 A1 Mar. 10, 2016

(51) Int. Cl.
| | |
|---|---|
| *H01L 27/088* | (2006.01) |
| *H01L 29/165* | (2006.01) |
| *H01L 29/10* | (2006.01) |
| *H01L 29/08* | (2006.01) |
| *H01L 29/205* | (2006.01) |
| *H01L 29/423* | (2006.01) |
| *H01L 29/78* | (2006.01) |
| *H01L 29/739* | (2006.01) |
| *H01L 29/06* | (2006.01) |
| *H01L 29/66* | (2006.01) |

(52) U.S. Cl.
CPC ......... *H01L 27/088* (2013.01); *H01L 29/068* (2013.01); *H01L 29/0673* (2013.01); *H01L 29/0847* (2013.01); *H01L 29/1033* (2013.01); *H01L 29/165* (2013.01); *H01L 29/205* (2013.01); *H01L 29/42376* (2013.01); *H01L 29/66439* (2013.01); *H01L 29/66469* (2013.01); *H01L 29/7391* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 5,475,244 A | * | 12/1995 | Koizumi | H01L 29/66772 257/192 |
| 2003/0094637 A1 | * | 5/2003 | Awano | H01L 21/84 257/288 |
| 2006/0118839 A1 | * | 6/2006 | Sugahara | B82Y 10/00 257/295 |

(Continued)

*Primary Examiner* — Ali Naraghi
(74) *Attorney, Agent, or Firm* — Haynes and Boone, LLP

(57) ABSTRACT

A method and structure for suppressing band-to-band tunneling current in a semiconductor device having a high-mobility channel material includes forming a channel region adjacent to and in contact with one of a source region and a drain region. A tunnel barrier layer may be formed such that the tunnel barrier layer is interposed between, and in contact with, the channel region and one of the source region and the drain region. In some embodiments, a gate stack is then formed over at least the channel region. In various examples, the tunnel barrier layer includes a first material, and the channel region includes a second material different than the first material. In some embodiments, the semiconductor device may be oriented in one of a horizontal or vertical direction, and the semiconductor device may include one of a single-gate or multi-gate device.

19 Claims, 13 Drawing Sheets

(56) References Cited

U.S. PATENT DOCUMENTS

| | | | | |
|---|---|---|---|---|
| 2010/0123203 A1* | 5/2010 | Bhuwalka | ............ | H01L 29/7391 |
| | | | | 257/402 |
| 2011/0084319 A1* | 4/2011 | Zhu | ........................ | B82Y 10/00 |
| | | | | 257/288 |
| 2011/0210375 A1* | 9/2011 | Ikeda | ..................... | B82Y 10/00 |
| | | | | 257/192 |

* cited by examiner

LEAKAGE CURRENT SUPPRESSION METHODS AND RELATED STRUCTURES

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Toward that end, high-mobility materials (e.g., III-V materials, germanium, and silicon germanium) are being researched and have gained considerable interest as silicon-channel replacements. Such interest is largely due to the high intrinsic carrier mobility of high-mobility materials in comparison to silicon. Some advantages of using materials with a higher intrinsic mobility include increased device drive current (e.g., even at reduced supply voltages), reduced intrinsic delay, improved high-frequency performance (e.g., for radio-frequency applications), as well as other benefits as known in the art.

However, high-mobility materials may also have a low transport effective mass and a reduced bandgap (e.g., as compared to silicon). A reduced bandgap and low transport effective mass implies that band-to-band tunneling (BTBT) current in the subthreshold regime will be high and will be much higher than for silicon. Further, because BTBT current does not exponentially decrease with decreasing gate voltage (e.g., as compared to thermionic emission), the BTBT current will set a minimum leakage current level. Thus, high-mobility materials may only be used in high performance (HP) devices, which can sustain larger leakage currents, as compared to low operating power (LOP) or low standby power (LSTP) devices, which require much lower leakage current levels. Yet, industry requirements call for all three device types (HP, LOP, and LSTP) to be available on a single integrated circuit (IC) chip, necessitating the integration of different technologies (i.e., materials, devices, etc.) on the same chip. For example, HP devices may be implemented using high-mobility materials, while LOP and LSTP devices are implemented using silicon, all on a single chip. Such integration of different technologies adds additional cost, complexity, and process challenges (e.g., non-compatible thermal budgets). Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
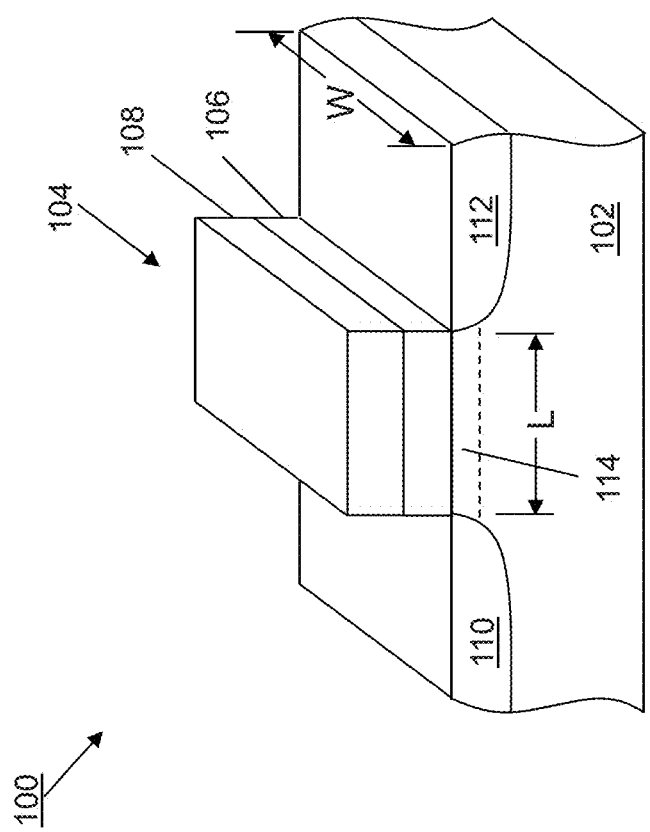
FIG. 1 is perspective view of a metal-oxide-semiconductor (MOS) transistor.
Figure 2:
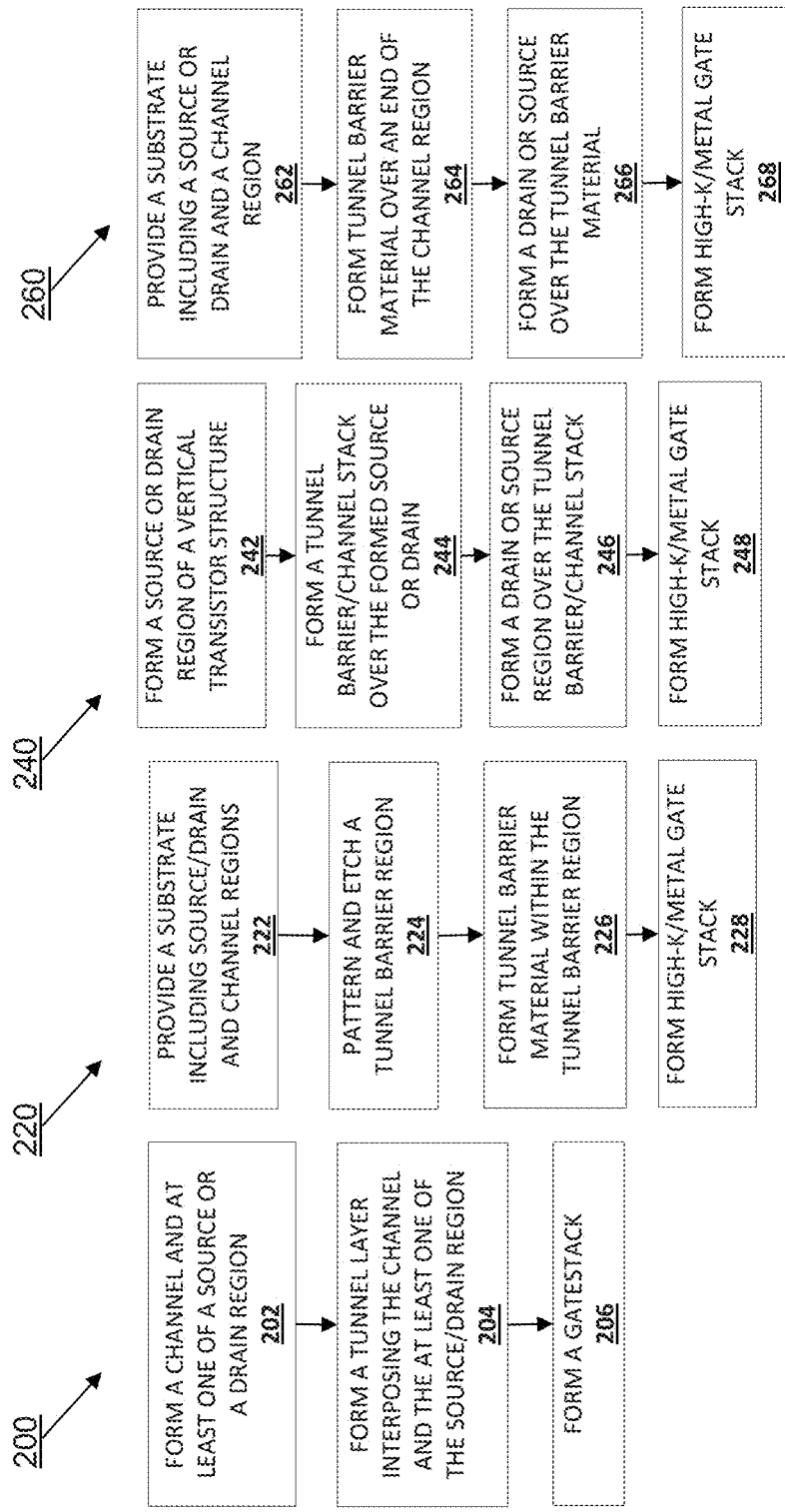
FIGS. 2A-2D are flow charts of various methods of fabricating a semiconductor device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form planar or multi-gate transistors (planar or vertical), which may include fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a metal-oxide-semiconductor (MOS) transistor 100. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric 106 may include silicon dioxide or other suitable dielectric. The gate dielectric 106 may be formed by ALD, physical vapor deposition (PVD), oxidation, and/or other suitable methods. In various embodiments, the gate electrode 108 includes a conductive layer such as W, TiN, TaN, WN, Re, Ir, Ru, Mo, Al, Cu, Co, Ni, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114.

Conventionally, silicon (Si) has been used as the substrate 102, and thus as the channel region 114, of the transistor 100. To meet the demands of advanced integrated circuit (IC) devices and processes, high-mobility materials (e.g., III-V materials, germanium, and silicon germanium) are being researched and have gained considerable interest as silicon-channel replacements. Thus, in some examples, the channel region 114 may include a high-mobility material. High-mobility materials, as used herein, include those materials having an electron mobility greater than silicon, for example, which has an intrinsic electron mobility at room temperature (300 K) of around 1350 $cm^2$/V-s and a hole mobility of around 480 $cm^2$/V-s. In some examples, the substrate 102 may include a high-mobility material. However, in some cases, a high-mobility material may be grown (e.g., by an epitaxial process) over the substrate 102 to form a high-mobility channel region 114. Advantages of using materials with a higher intrinsic mobility (e.g., as compared to Si) may include, for example, increased device drive current, reduced intrinsic delay, improved high-frequency performance, as well as other benefits as known in the art.

While there are clear advantages to using high-mobility materials, properties of such materials (e.g., a low transport effective mass and a reduced bandgap compared to Si) may lead to degraded transistor 100 performance. For example, the reduced bandgap and low transport effective mass of high-mobility materials implies that band-to-band tunneling (BTBT) current in the subthreshold regime, for devices utilizing high-mobility materials, will be high and will be much higher than for silicon. Further, because BTBT current does not exponentially decrease with decreasing gate voltage (e.g., as compared to thermionic emission), the BTBT current will set a minimum leakage current level. Thus, high-mobility materials may conventionally only be used in high performance (HP) devices, which can sustain larger leakage currents, as compared to low operating power (LOP) or low standby power (LSTP) devices, which require much lower leakage current levels. In some examples, the industry standard limit for leakage current is about 100 nA/μm for HP devices, about 5 nA/μm for LOP devices, and about 10 pA/μm for LSTP devices. Nevertheless, industry requirements call for all three device types (HP, LOP, and LSTP) to be available on a single IC chip, necessitating the integration of different technologies (i.e., materials, devices, etc.) on the same chip. For example, HP devices may be implemented using high-mobility materials, while LOP and LSTP devices are implemented using silicon, all on a single chip. Such integration of different technologies adds additional cost, complexity, and process challenges (e.g., non-compatible thermal budgets).

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for suppressing leakage current in devices having high-mobility channel materials. In some embodiments, a conduction band tunnel barrier (TB) layer is formed at the drain side of a device (e.g., the transistor 100) channel region, the device having a high-mobility channel material, in order to suppress and/or significantly decrease the BTBT current. In other examples, a valence band tunnel barrier (TB) may be formed at the source side of a device channel region to suppress such BTBT current. While embodiments of the present disclosure may be primarily discussed with reference to N-type transistors, it will be understood that the embodiments disclosed herein may equally be applied to P-type transistors, where such implementations can be readily deduced by one skilled in the art, for example by symmetry to the N-type device implementations discussed below. By way of example, the tunnel barrier (TB), formed either at the drain or source side of the device channel region, may be created by inserting a layer (e.g., into the channel region) with a different bandgap than the high-mobility material used for the channel region. Thus, a heterojunction, having a band-offset (e.g., conduction and/or valence band-offset), is created between the high-mobility channel region material and the tunnel barrier layer.

In some examples, the TB layer includes gallium antimonide (GaSb) or indium gallium arsenide (InGaAs), which forms a heterojunction to an indium arsenide (InAs) high-mobility channel layer. In other examples, the TB layer includes indium aluminum arsenide (InAlAs), which forms a heterojunction to an InGaAs high-mobility channel layer. In yet other examples, the TB layer includes silicon (Si) or silicon germanium (SiGe), which forms a heterojunction to a germanium (Ge) high-mobility channel layer. In some embodiments, the TB layer includes Si, SiGe, or indium phosphide (InP), which forms a heterojunction to a Ge high-mobility channel layer. In still other examples, the TB layer includes InAs or aluminum antimonide (AlSb), which forms a heterojunction to a GaSb high-mobility channel layer. While a few examples of materials useful for forming a tunnel barrier in the channel region of devices using high-mobility channel materials have been described, one of skill in the art in possession of this disclosure will recognize other structures, materials, and methods for forming the TB layer without departing from the scope of the present disclosure. For example, in some embodiments, the TB layer may be formed by use of a confinement structure, a hetero metal gate, grain boundaries, an electrostatic barrier, and/or a combination thereof.

Referring now to FIGS. 2A, 2B, 2C and 2D, illustrated are methods 200, 240, 260, and 280 respectively, of fabricating a semiconductor device including a transistor device having a tunnel barrier (TB). The methods 200, 240, 260, 280 collectively may be used to form the TB at a drain or source side of a transistor device having a high-mobility channel material, and thereby suppress device leakage current (e.g., OFF-state leakage current). In some embodiments, one or more of the methods 200, 240, 260, 280 may be implemented on a single-gate planar device, such as the transistor 100 described above with reference to FIG. 1. Thus, one or more aspects discussed above with reference to the transistor 100 may also apply to the methods 200, 240, 260, or 280. In some embodiments, one or more of the methods 200, 240, 260, 280 may be implemented on a multi-gate device, oriented in a horizontal or vertical direction, and may include one or more of double-gate devices, tri-gate devices, FinFET devices, gate-all-around (GAA) devices, Omega-gate (Ω-gate) devices, or Pi-gate (Π-gate) devices. Additionally, FIGS. 3-14 include various schematic views of an exemplary transistor device fabricated according to one or more steps of the methods 200, 240, 260, 280 of FIGS. 2A, 2B, 2C and 2D.

It is understood that parts of the methods 200, 240, 260, 280 and/or the exemplary transistor device may be fabricated by a well-known complementary metal-oxide-semiconductor (CMOS) technology process flow, and thus some processes are only briefly described herein. Further, the exemplary transistor device may include various other devices and features, such as additional transistors, bipolar junction transistors, resistors, capacitors, diodes, fuses, etc., but is simplified for a better understanding of the inventive concepts of the present disclosure. Further, in some embodiments, the exemplary transistor device includes a plurality of semiconductor devices (e.g., transistors), which may be interconnected.

The exemplary transistor device illustrated in FIGS. 3-14 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring first to the method 200, the method 200 provides a general process flow for fabricating various embodiments of a semiconductor device including a tunnel barrier. In particular, in some examples, the methods 220, 240, or 260 may be described as various embodiments of the general method 200. Thus, additional detail the processes and structures according to embodiments of the present disclosure are reserved for discussion of the methods 220, 240, and 260, and the method 200 is only described here in general terms as a basis for the discussion that follows. The method 200 begins at block 202 where a channel and at least one of a source or drain region is formed (e.g., within or on a semiconductor substrate). The method 200 proceeds to block 204 where a tunnel layer (i.e., a tunnel barrier) is formed. In the embodiments described herein, the tunnel layer is formed such that the tunnel layer interposes the channel and the at least one of the source or drain region formed at block 202. In various embodiments, the channel is formed of a material having a different composition (including a different bandgap) than a composition of the tunnel layer. In various embodiments, the tunnel layer is formed of a material having a different composition than a composition of the adjacent source/drain. Thus, a heterojunction is formed at a source end or a drain end, providing for suppressed and/or significantly decreased BTBT current. In the embodiments described herein, the TB layer may be formed at either the source end or the drain end for both N-type and P-type transistors. The method 200 then proceeds to block 206 where a gate stack is formed. In some embodiments, the gate stack does not overlap the tunnel layer. In some examples, the gate stack at least partially overlaps the tunnel layer. In some cases, the gate stack fully overlaps the tunnel layer.

Figure 3:
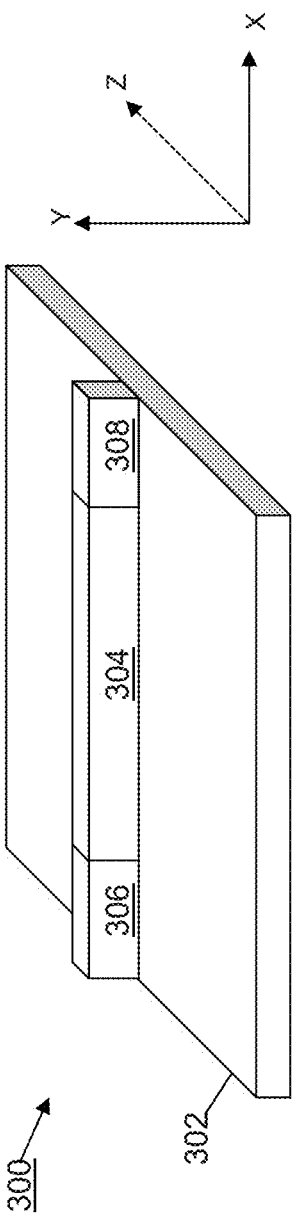
FIGS. 3-8 are perspective views of an embodiment of a semiconductor device corresponding to one or more steps of the methods of FIGS. 2A and 2B, and FIG. 3A provides a set of reference axes (X, Y, Z)

Referring now to the method 220, which is an embodiment of the method 200, the method 220 begins at block 222 where a substrate including source, drain, and channel regions is provided. In some embodiments, the substrate, source and drain may be substantially similar to the substrate, source and drain discussed above with reference to FIG. 1. Referring to the example of FIG. 3, illustrated is a planar semiconductor device 300 including a semiconductor substrate 302, a channel region 304, a source region 306, and a drain region 308. A set of reference axes (X, Y, Z) are provided in FIG. 3A to illustrate the orientation of the device 300. While the examples of FIGS. 3-8 are described with reference to a horizontally-oriented device structure, the methods described herein are not limited to such structures, as described in further detail below. Although schematically illustrated as disposed on the substrate 302, the channel region 304, the source region 306, and the drain region 308 may be formed within (i.e., integrated within) the substrate 302. For example, in some cases, the channel region 304 may include the same material as the substrate 302, such as when the substrate 302 includes a high-mobility material (e.g., III-V materials, germanium, and silicon germanium). In some embodiments, the channel region 304 may include a high-mobility material grown (e.g., by an epitaxial growth process) over the substrate 302, where the substrate 302 includes a material different from the channel region 304 material. In some embodiments, the source and drain regions 306, 308 may be formed by a well-known process, such as one or more of a photolithography process, an ion implantation process, an annealing process, a diffusion process, an epitaxial growth process, and/or other process known in the art. Upon completion of fabrication of the device 300, and in operation, current flows between the source and drain regions 306, 308 and through the channel region 304. A current density flowing between the source and drain regions 306, 308 is dependent on the material used to form each of the source, drain, and channel regions 306, 308, 304, as well as a doping concentration in each region and the applied voltage bias (e.g., gate voltage and/or drain-to-source voltage). Thus, as described above, high-mobility materials may be used for at least the channel region 304, as well as for the source and drain regions 306, 308, to improve the drive current of the device 300. However, the reduced bandgap and low transport effective mass of high-mobility materials (e.g., as used for the channel region 304) may lead to increased band-to-band tunneling (BTBT) current, resulting in degraded device 300 performance. Therefore, in accordance with the present embodiments, a TB layer is formed within the channel region to suppress and/or significantly decrease the BTBT current.

The method 220 proceeds to block 224, where a tunnel barrier region is patterned and etched. Referring to the example of FIG. 4, a tunnel barrier region 310 is patterned and etched at a drain end 312 of the device 300. In an embodiment, the tunnel barrier region 310 may be patterned by photolithography or e-beam lithography. For example, the photolithography process may include forming a photoresist layer (resist) overlying the substrate 302, exposing the resist to a pattern, performing post-exposure bake processes, and developing the resist to form a masking element including the resist. In some embodiments, pattering the resist to form the making element may be performed using an electron beam (e-beam) lithography process. The masking element may then be used to protect regions of the substrate while an etch process forms recesses into the substrate, thereby forming the tunnel barrier region 310. The etching used to form the tunnel barrier region 310 may include a dry etch (e.g., RIE, ICP), wet etch, or other suitable process.

Figure 4:
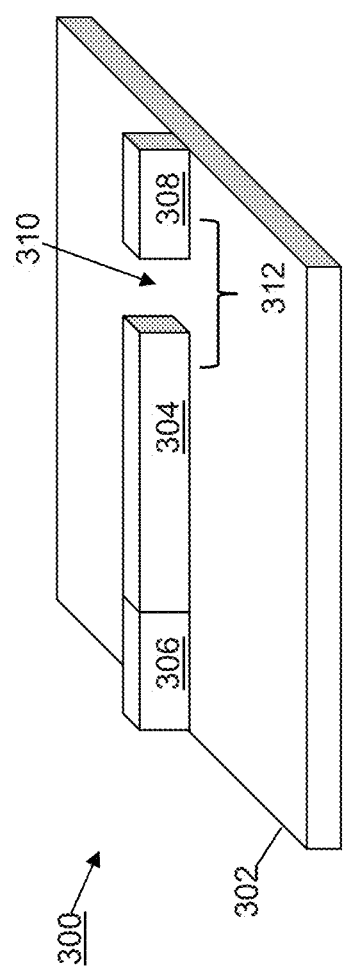
Figure 5:
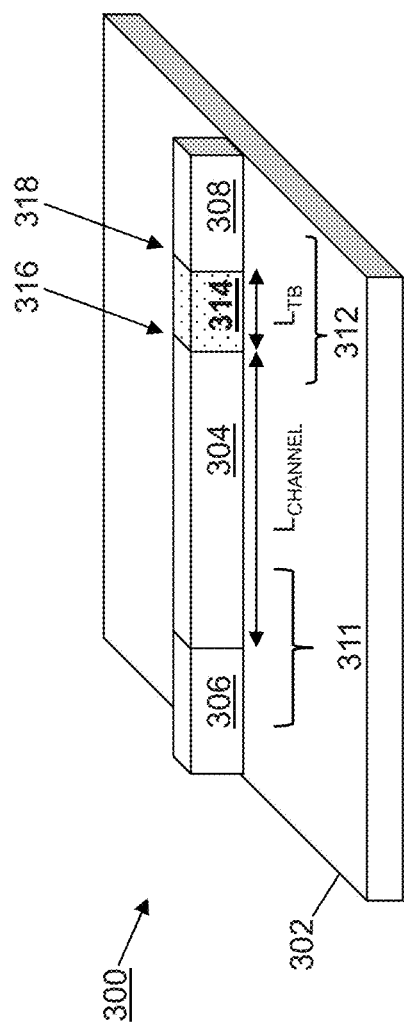

The method 220 proceeds to block 226, where a tunnel barrier (TB) material layer is formed within the tunnel barrier region 310. In an embodiment of block 226 and with reference to FIG. 5, after formation of the tunnel barrier region 310, a TB material layer 314 is regrown within the tunnel barrier region 310 (FIG. 4). As shown in FIG. 5, the TB layer 314 is formed at the drain end 312 between the channel region 304 and the drain region 308. Thus, the TB layer 314 is within the source-to-drain current path, as described above. In some embodiments, as described below, the TB layer 314 may be formed at a source end 311 between the channel region 304 and the source region 306. In various examples, a TB layer length ($L_{TB}$) and/or thickness may be configured as needed in accordance with device, process, and/or technology requirements. In various embodiments, the TB layer 314 is regrown using an epitaxial growth process such as molecular beam epitaxy (MBE), metalorganic chemical vapor deposition (MOCVD), and/or other suitable regrowth process. By way of example, the regrown TB layer 314 may include any of a plurality of high-mobility semiconductor materials such as SiGe, strained Ge, Ge, GaAs, GaP, InP, InAs, InSb, GaAsP, InAlAs, AlGaAs, InGaAs, GaInP, and/or GaInAsP, or combinations thereof. Additionally, in some embodiments, the TB layer 314 may be in-situ doped during the epitaxial growth process.

It should be noted for clarity of discussion that the regrown TB layer 314 may include a material having a different composition than a composition of either of the channel region 304 or the drain region 308. Moreover, the regrown TB layer 314 may include a material having a different bandgap than a bandgap of the material used for either of the channel region 304 or the drain region 308. Thus, a heterojunction is formed at a TB layer/channel region interface 316 and at a TB layer/drain region interface 318. The heterojunctions at each of the TB layer/channel region interface 316 and at the TB layer/drain region interface 318 result in band-offsets (e.g., conduction and/or valence band-offset) at each of the two interfaces 316, 318, which will impact the source-drain current flow through the channel region 304, as described in more detail below. In some embodiments, the band-offset at the interfaces 316, 318 results in a suppressed and/or significantly decreased BTBT current.

In some embodiments, selection of a material for each of the channel region 304, the TB layer 314, and the source/drain regions 306, 308 depends on whether the device 300 is implemented as an N-type or P-type transistor. By way of example, the TB layer 314 may include at least one of GaSb, InGaAs, InAlAs, Si, or SiGe for N-type transistors, and the TB layer 314 may include at least one of Si, SiGe, InP, InAs, or AlSb for P-type transistors. Merely for purposes of illustration, exemplary combinations of materials, used in a given N- or P-type transistor, for each of the TB layer 314, the channel region 304, and the source/drain regions 306, 308 is provided below. In some examples, for N-type transistors, the TB layer 314 includes GaSb or InGaAs, and the channel region 304 and source/drain regions 306, 308 include InAs. In other examples, for N-type transistors, the TB layer 314 includes InAlAs, and the channel region 304 and source/drain regions 306, 308 include InGaAs. In yet other examples, for N-type transistors, the TB layer 314 includes Si or SiGe, and the channel region 304 and source/drain regions 306, 308 include Ge. In some embodiments, for P-type transistors, the TB layer 314 includes Si, SiGe, or InP, and the channel region 304 and source/drain regions 306, 308 include Ge. In still other examples, for P-type transistors, the TB layer 314 includes InAs or AlSb, and the channel region 304 and source/drain regions 306, 308 include GaSb. The suppression of the BTBT current, achieved in some examples as a result of the band-offset introduced at the heterojunction interfaces (e.g., the interfaces 316, 318), is described in more detail with respect to the energy band diagrams of FIGS. 16-18.

The method 220 proceeds to block 228, where a high-K/metal gate stack is formed. In some embodiments, the high-K/metal gate stack is formed using a gate-first process. Alternatively, in some examples, the high-K/metal gate stack is formed using a gate-last process. In some examples, a gate-first process includes formation of a gate stack prior to source/drain formation or source/drain dopant activation. Merely by way of example, a gate-first process may include gate dielectric and metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation. In some examples, a gate-late process includes forming a dummy gate stack that will be replaced by a final gate stack at a subsequent processing stage of the semiconductor device 300. For example, a dummy gate stack may be replaced at a later processing stage by a high-K dielectric layer (HK) and metal gate electrode (MG).

Figure 6:
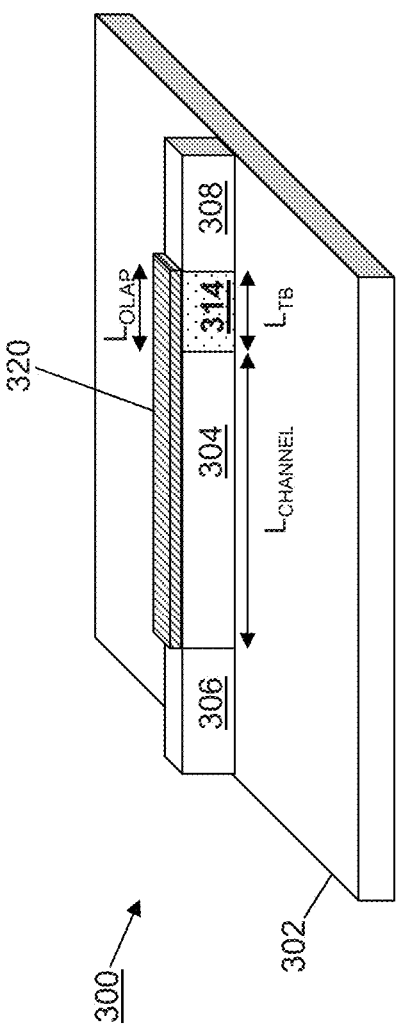
Figure 7:
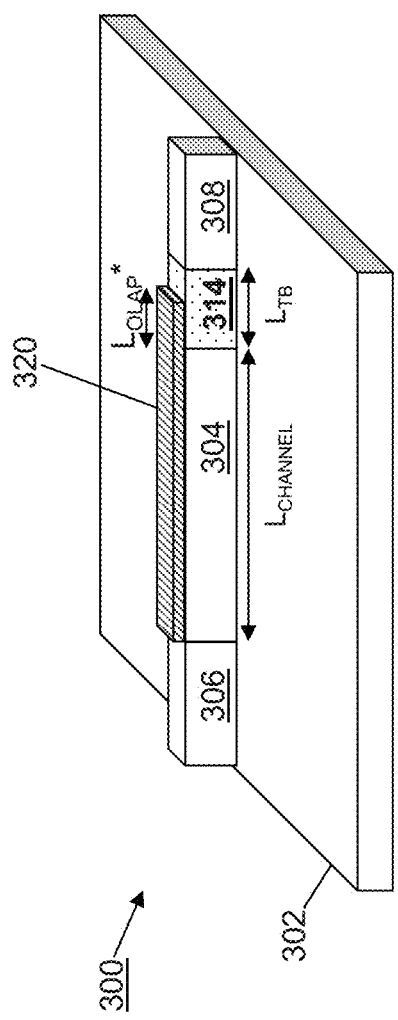
Figure 8:
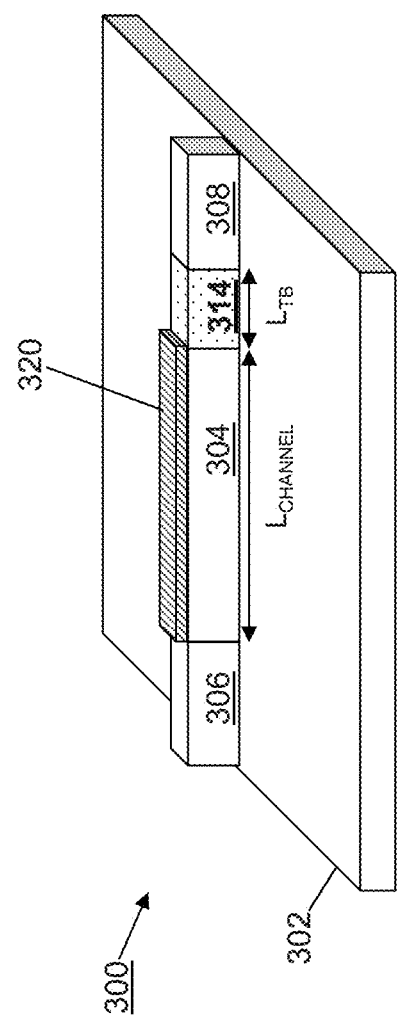
Figure 9:
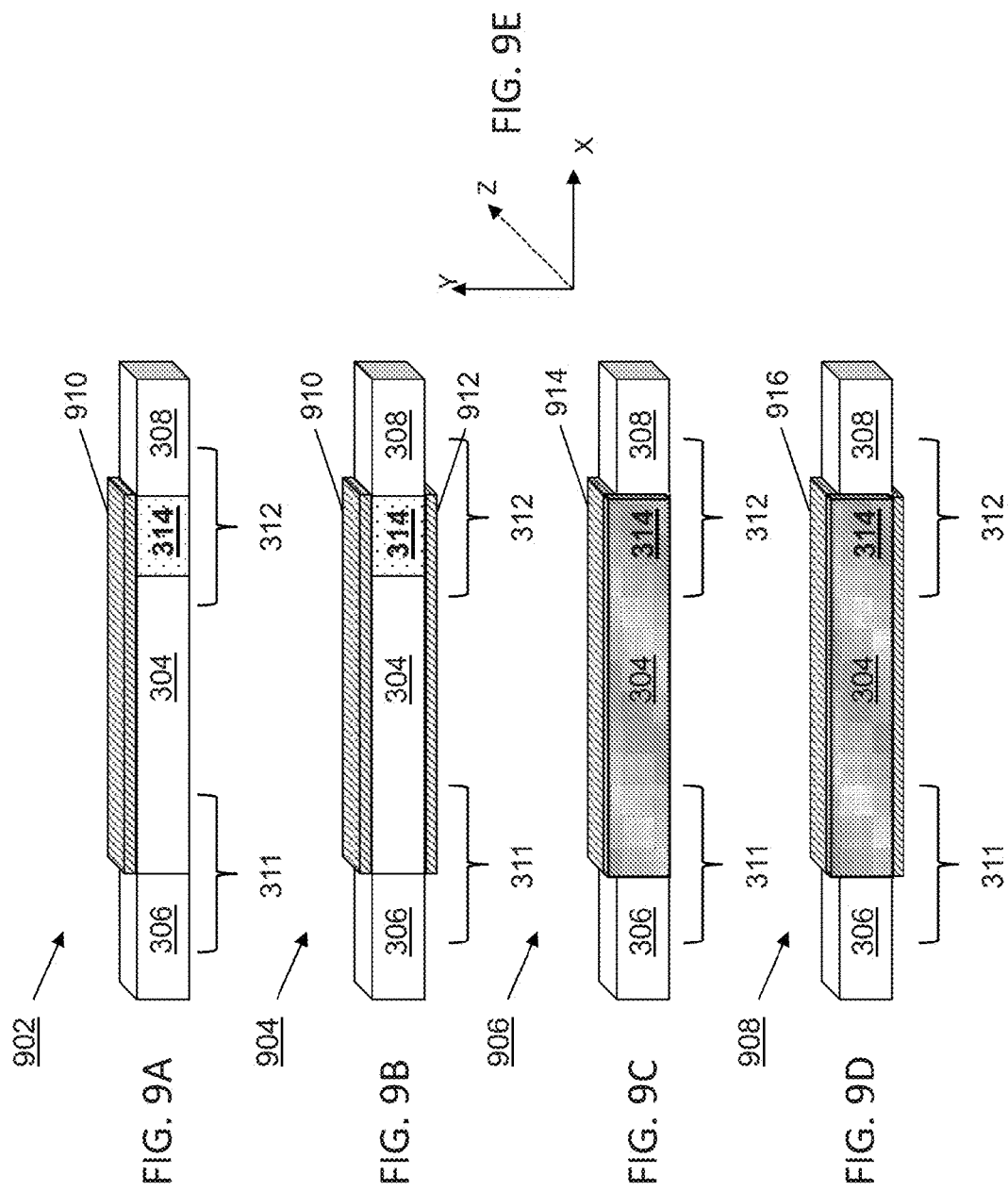
FIGS. 9A-9D are schematic views of single- and multi-gate devices, with a tunnel barrier at a drain end, fabricated according to one or more steps of the methods of FIGS. 2A and 2B, and FIG. 9E provides a set of reference axes (X, Y, Z)
Figure 10:
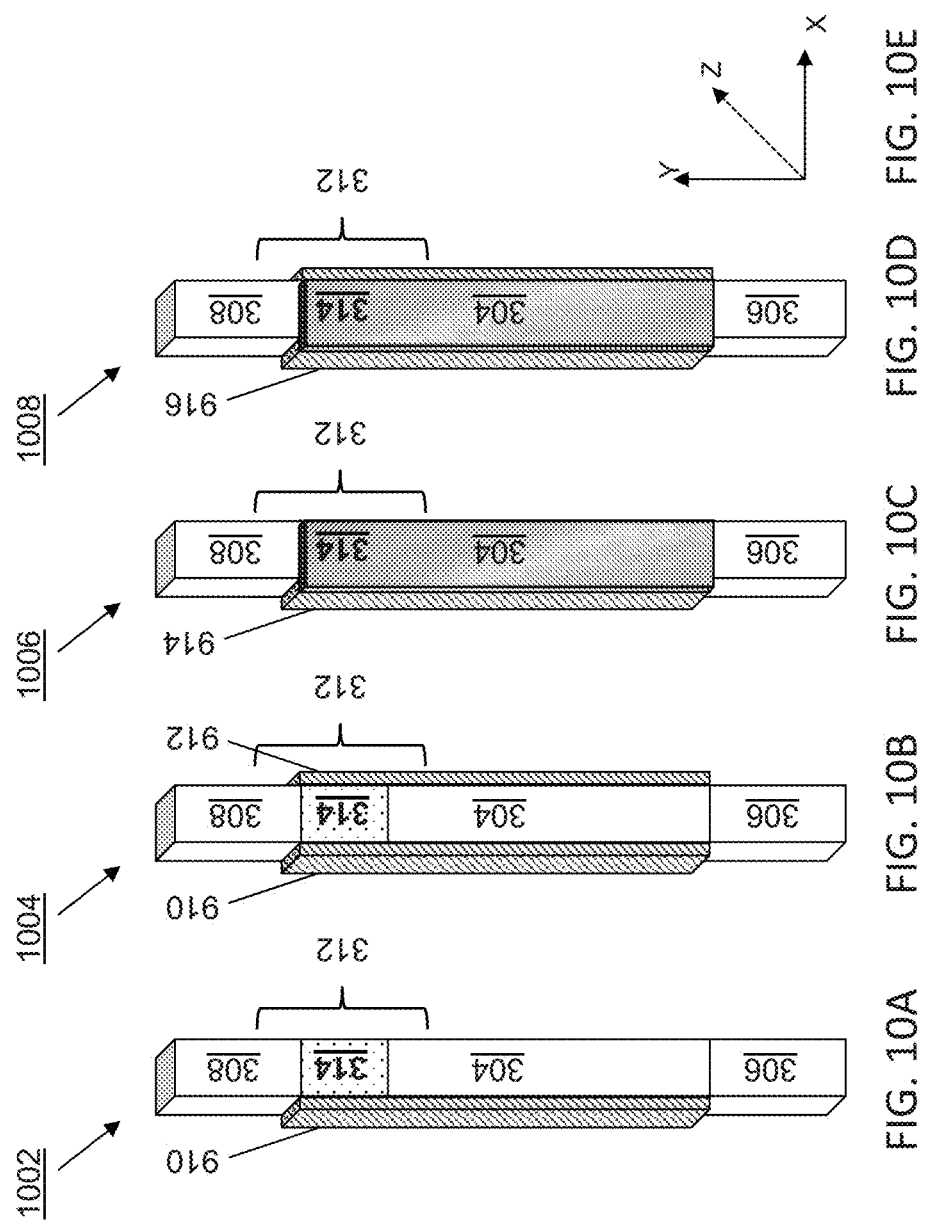
FIGS. 10A-10D are schematic views of single- and multi-gate devices, with a tunnel barrier at a drain end, fabricated according to one or more steps of the methods of FIGS. 2A and 2C, and FIG. 10E provides a set of reference axes (X, Y, Z)

Referring to the example of FIG. 6, and in an embodiment of block 228, a high-K metal gate stack 320 is formed on the device 300. The high-K/metal gate stack 320 may include an interfacial layer, formed over the high-mobility channel region 304 and the TB layer 314, a high-K gate dielectric layer formed over the interfacial layer, and a metal layer formed over the high-K gate dielectric layer. High-K gate dielectrics, as used and described herein, include dielectric material having a high dielectric constant, for example, greater than that of thermal silicon oxide (~3.9). The metal layer used within high-K/metal gate stack 320 may include a metal, metal alloy, or metal silicide. Additionally, the formation of the high-K/metal gate stack 320 includes depositions to form various gate materials and one or more CMP processes to remove excessive gate materials and thereby planarize a top surface of the semiconductor device 300.

By way of example, the interfacial layer within high-K/metal gate stack 320 may include a dielectric material such as silicon oxide ($SiO_2$), HfSiO, or silicon oxynitride (SiON). The interfacial layer of the high-K/metal gate stack 320 may be formed by chemical oxidation, thermal oxidation, atomic layer deposition (ALD), chemical vapor deposition (CVD), and/or other suitable method. The gate dielectric layer of the high-K/metal gate stack 320 may include a high-K dielectric layer such as hafnium oxide ($HfO_2$). Alternatively, the gate dielectric layer of the high-K/metal gate stack 320 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods. The metal layer of the high-K/metal gate stack 320 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the high-K/metal gate stack 320 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The metal layer of the high-K/metal gate stack 320 may be formed by ALD, PVD, CVD, e-beam evaporation, or other suitable process. Further, the metal layer of the high-K/metal gate stack 320 may be formed separately for N-FET and P-FET transistors which may use different metal layers. In various embodiments, a CMP process may be performed to remove excessive metal from the metal layer of the high-K/metal gate stack 320, and thereby provide a substantially planar top surface of the metal layer of the high-K/metal gate stack 320.

As shown in the example of FIG. 6, the high-K metal gate stack 320 may overlap the TB layer 314, for example, by an overlap length ($L_{OLAP}$). In various embodiments, the overlap of the gate stack 320 on the TB layer 314 provides for electrostatic modulation (e.g., via a voltage bias applied to the gate stack 320) of a barrier height at the heterojunction interfaces 316, 318 (e.g., by modulation of the barrier height of the TB layer 314). Thus, by such electrostatic gate modulation, the barrier height of the TB layer 314 may be increased while the device 300 is operated in a subthreshold regime, for example, to further block BTBT current. Similarly, by electrostatic gate modulation, the barrier height of the TB layer 314 may be decreased while the device 300 is operated in an ON-state, for example, so as to not impede ON-state current flow. An amount of electrostatic gate modulation that may be provided by the gate stack 320 may be tuned by varying the overlap length ($L_{OLAP}$). For example, with reference to FIG. 7, a reduced overlap length ($L_{OLAP}* < L_{OLAP}$) provides a reduction in the amount of electrostatic gate modulation available via the gate stack 320. Moreover, with reference to the example of FIG. 8, some embodiments may provide substantially no overlap of the gate stack 320 to the TB layer 314. However, even in embodiments having substantially no overlap, there may still be some electrostatic modulation available via the gate stack 320, for example, due to fringing electric fields which may exist between the gate stack 320 and the TB layer 314.

The semiconductor device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features to form a functional circuit that may include one or more devices 300. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Moreover, additional process steps may be implemented before, during, and after the method 220, and some process steps described above may be replaced or eliminated in accordance with various embodiments of the method 220. For example, at least parts of the method 220 may be implemented to fabricate a multi-gate device which includes the TB layer 314. With reference to FIGS. 9A-9D, illustrated therein are schematic views of various single and/or multi-gate transistors which include the TB layer 314 at the drain end 312 of the device. For clarity of discussion, a substrate (e.g., the substrate 302) is not shown in the figures; however, a set of reference axes (X, Y, Z) provided in FIG. 9E illustrate the orientation of the devices schematically depicted in FIGS. 9A-9D. Referring now to FIG. 9A, a single-gate device 902 is shown. In some embodiments, the device 902 includes a gate stack 910 (e.g., which may be the gate stack 320) and may be substantially the same as the device 300 illustrated and described above with reference to FIGS. 3-8. Referring to FIG. 9B, there is illustrated a double-gate device 904. In various embodiments, the double-gate device 904 includes the gate stack 910 and a gate stack 912, having the channel region 304 as well as the TB layer 314 disposed therebetween. In some embodiments, the gate stacks 910 and/or 912 may only partially overlap the TB layer 314, as described above. Alternately, the gate stacks 910 and/or 912 may substantially not overlap the TB layer 314. Referring to FIG. 9C, there is illustrated a multi-gate device 906. In some embodiments, the multi-gate device 906 includes a gate stack 914 formed around three sides of the channel region 304 and the TB layer 314. In some embodiments, the gate stack 914 may only partially overlap the TB layer 314, as described above. Alternately, the gate stack 914 may substantially not overlap the TB layer 314. In some embodiments, the multi-gate device 906 includes a tri-gate device, a FinFET device, an Omega-gate (Ω-gate) device, or a Pi-gate (Π-gate) device. In some embodiments, for example when the multi-gate device 906 includes a FinFET device, the channel region 304 and the TB layer 314 may be integrated within a fin structure, and the source/drain regions 306, 308 may be formed in, on, or around the fin structure and on either side of the channel region 304 and the TB layer 314, as schematically shown in FIG. 9C. Referring to FIG. 9D, there is illustrated a gate-all-around (GAA) device 908. In some embodiments, the GAA device 908 includes a gate stack 916 which surrounds the channel region 304 and the TB layer 314. In some embodiments, the gate stack 916 may only partially overlap the TB layer 314, as described above. Alternately, the gate stack 916 may substantially not overlap the TB layer 314.

Referring now to the method 240, which is an embodiment of the method 200, the method 220 may be implemented to fabricate a single- or multi-gate device, including the TB layer 314, oriented in a vertical direction. With reference to FIGS. 10A-10D, illustrated therein are schematic views of various single- and/or multi-gate transistors which include the TB layer 314 at the drain end 312. For clarity of discussion, a substrate (e.g., the substrate 302) is not shown in the figures; however, a set of reference axes (X, Y, Z) provided in FIG. 10E illustrates the vertical orientation (substantially along the Y-axis) of the devices schematically depicted in FIGS. 10A-10D, where the substrate is oriented in a substantially horizontal direction. In some embodiments, the devices shown in FIGS. 10A-10D are vertically-oriented analogues of the devices shown in FIGS. 9A-9D. Thus, with reference to FIG. 10A, a vertically-oriented single-gate device 1002 is shown. With reference to FIG. 10B, there is illustrated a vertically-oriented double-gate device 1004. With reference to FIG. 10C, there is illustrated a vertically-oriented multi-gate device 1006, where the vertically-oriented multi-gate device 1006 may include a tri-gate device, a FinFET device, an Omega-gate (Ω-gate) device, or a Pi-gate (Π-gate) device. With reference to FIG. 10D, there is illustrated a gate-all-around (GAA) device 1008. For each of the embodiments illustrated in FIGS. 10A-10D, a given gate stack may only partially overlap the TB layer 314, as described above. Alternately, a given gate stack may substantially not overlap the TB layer 314.

The method 240 is provided merely as an example of an embodiment of forming vertical transistors which include the TB layer 314; however, other methods of forming vertical FETs as known in the art may also be used without departing from the scope of the present disclosure. Additionally, in various embodiments, the vertically-oriented devices illustrated in FIGS. 10A-10D may be fabricated according to a well-known CMOS technology process flow. Thus, the method 240 is only briefly described for purposes of clarity in the discussion. In an embodiment of the method 240, and with reference to the devices of FIGS. 10A-10D, the method 240 begins at block 242 where a source or drain region of a vertical transistor structure is formed. For example, the source region 306 may be formed. Thereafter, the method 240 proceeds to block 244 where a tunnel barrier/channel stack are formed over the source or drain region formed at block 242. By way of example a channel region, such as the channel region 304, is formed over the source region 306, followed by formation of the TB layer 314, to complete formation of the tunnel barrier/channel stack. In some embodiments, for example as discussed below with reference to FIGS. 13A-13D, the ordinal position of the channel region 304 and the TB layer 314 may be transposed. The method 240 then proceeds to block 246, where a drain or source region is formed over the tunnel barrier/channel stack. For example, the drain region 308 may be formed over the tunnel barrier/channel stack formed at block 244. The method 240 proceeds to block 248, where a high-K/metal gate stack is formed.

The semiconductor devices 1002, 1004, 1006, 1008 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more devices 1002, 1004, 1006, 1008. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 240, and some process steps described above may be replaced or eliminated in accordance with various embodiments of the method 240. For example, fabrication of at least some of the vertically-oriented device embodiments described herein may include the formation of semiconductor pillars (e.g., by patterning, etching, etc.). In some cases, fabrication of at least some of the vertically-oriented device embodiments described herein may include vertical nanowire growth, where the resulting devices include vertical nanowire devices.

Figure 11:
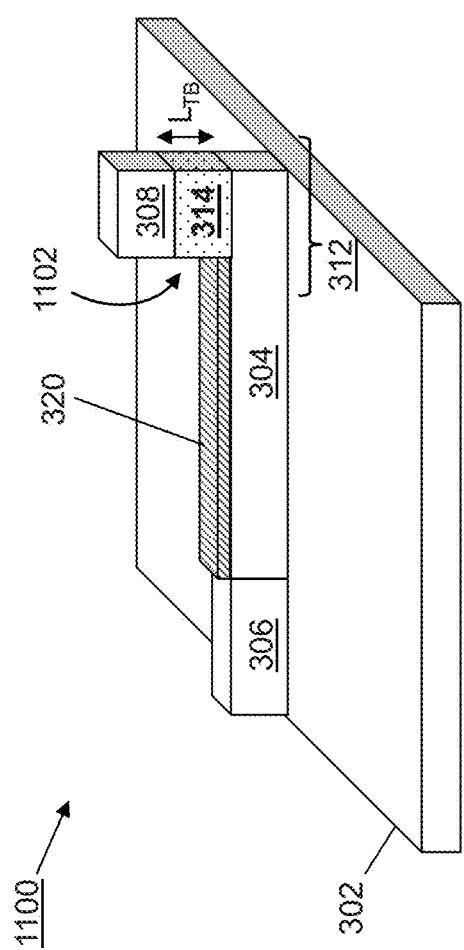
FIG. 11 is a schematic view of a device, with a tunnel barrier at a drain end, fabricated according to one or more steps of the methods of FIGS. 2A and 2D.
Figure 12:
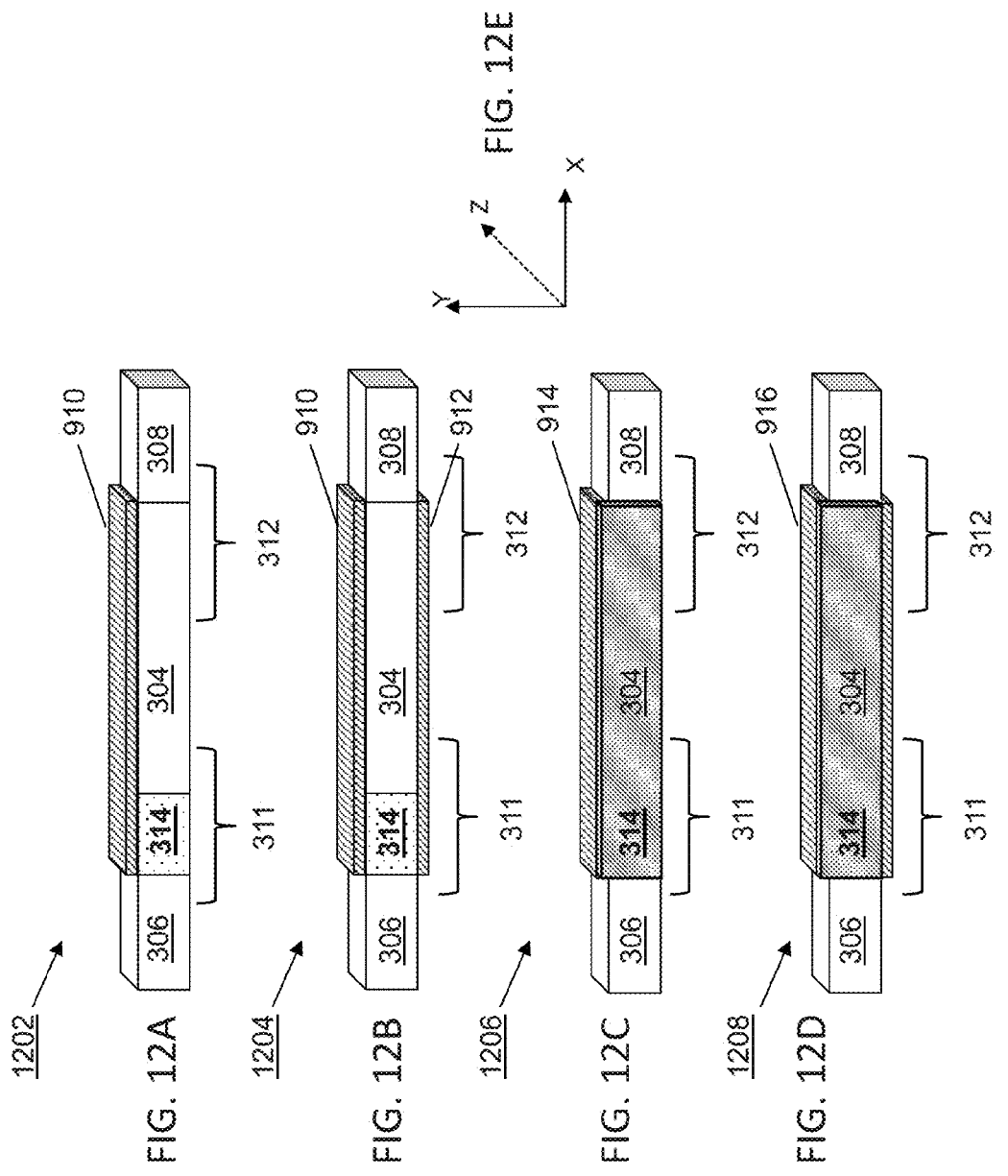
FIGS. 12A-12D are schematic views of single- and multi-gate devices, with a tunnel barrier at a source end, fabricated according to one or more steps of the methods of FIGS. 2A and 2B, and FIG. 12E provides a set of reference axes (X, Y, Z)
Figure 13:
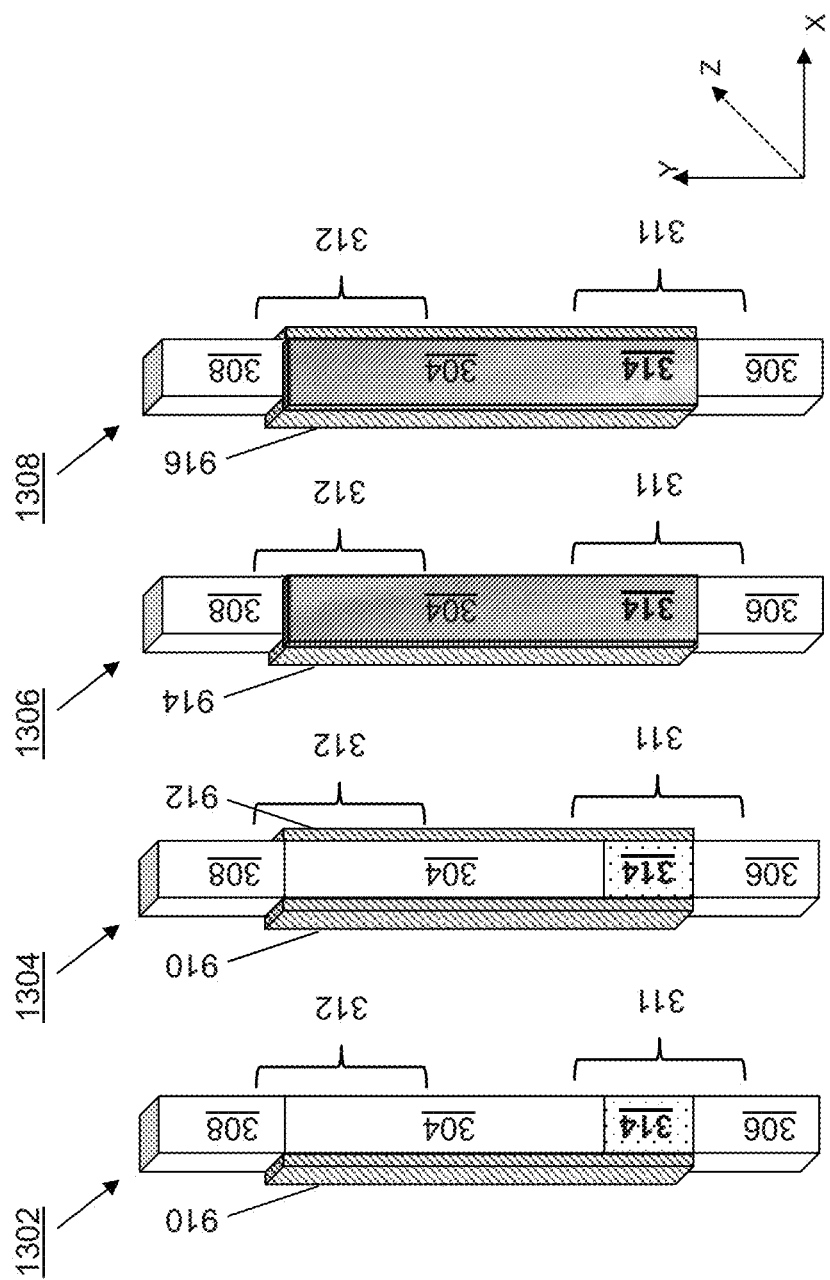
FIGS. 13A-13D are schematic views of single- and multi-gate devices, with a tunnel barrier at a source end, fabricated according to one or more steps of the methods of FIGS. 2A and 2C, and FIG. 13E provides a set of reference axes (X, Y, Z)

Referring now to the method 260, which is an embodiment of the method 200, the method 260 describes embodiments for forming the TB 314 at the drain end 312 of a transistor device, where the TB layer 314 may be disposed over an end of the high-mobility channel. The method 260 begins at block 262 where a substrate including source or drain, and channel region, is provided. In some embodiments, the substrate, source or drain may be substantially similar to the substrate, source and drain discussed above with reference to FIG. 1. Referring to the example of FIG. 11, illustrated is a semiconductor device 1100 including a semiconductor substrate 302, a channel region 304 and a source region 306. As described above, the channel region 304 may include a high-mobility material (e.g., III-V materials, germanium, and silicon germanium). Similarly, as described above, the source regions 306 may be formed by a well-known process, such as one or more of a photolithography process, an ion implantation process, an annealing process, a diffusion process, an epitaxial growth process, and/or other process known in the art.

The method 260 then proceeds to block 264, where a tunnel barrier (TB) material is formed over an end of the channel region. In an embodiment of the block 264, and with reference to FIG. 11, a TB material layer (i.e., the TB layer 314) is formed over the drain end 312 of the device 1100. Rather than patterning and etching a TB region and re-growing a TB material layer, such as described above with reference to FIG. 4, the TB layer 314 may be directly formed over the drain end 312. In some embodiments, the TB layer 314 may be formed by one or more well-known methods such as photolithography (or e-beam lithography), layer deposition (e.g., evaporation, sputtering, epitaxial growth, atomic layer deposition, etc.), etching (e.g., wet or dry etching), etc.

The method 260 then proceeds to block 266, where a drain or source is formed over the TB material layer. In an embodiment of the block 266, and with reference to FIG. 11, a drain region (i.e., the drain region 308) is directly formed over the TB layer 314. Similar to the formation of the TB layer 314 over the end of drain end 312, the drain region 308 may be formed over the TB layer 314 by one or more well-known methods such as photolithography (or e-beam lithography), layer deposition (e.g., evaporation, sputtering, epitaxial growth, atomic layer deposition, etc.), etching (e.g., wet or dry etching), etc.

Thus, similar to the example of FIG. 5 above, the TB layer 314 of FIG. 11 is disposed between the channel region 304 and the drain region 308, and the TB layer 314 is within the source-to-drain current path. A TB layer length ($L_{TB}$) and/or thickness, measured vertically in the example of FIG. 11, may again be configured as needed in accordance with device, process, and/or technology requirements. As described above, the TB layer 314 may include any of a plurality of high-mobility semiconductor materials such as SiGe, strained Ge, Ge, GaAs, GaP, InP, InAs, InSb, GaAsP, InAlAs, AlGaAs, InGaAs, GaInP, and/or GaInAsP, or combinations thereof. Additionally, in some embodiments, the TB layer 314 may be in-situ doped during the epitaxial growth process. In addition, and as described above with reference to FIG. 5, the TB layer 314 may include a material having a different composition, and thus a different bandgap, than a composition of either of the channel region 304 or the drain region 308, providing for suppressed and/or significantly decreased BTBT current. The method 260 then proceeds to block 268, where a high-K/metal gate stack is formed. The process of forming the high-K/metal gate stack, and the materials used, may be substantially similar to that described above with reference to block 228 of the method 220. In some embodiments, the high-K/metal gate stack 320 illustrated in FIG. 11 may not overlap the TB layer 314. In some cases, the high-K/metal gate stack 320 may also be formed along a sidewall 1102 of the TB layer 314, for example, to provide electrostatic gate modulation of the barrier height of the TB layer 314.

The semiconductor device 1100 may undergo further processing to form various features and regions known in the art. For example, subsequent processing may form various contacts/vias/lines and multilayers interconnect features (e.g., metal layers and interlayer dielectrics) on the substrate 302, configured to connect the various features to form a functional circuit that may include one or more devices 1100. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 260, and some process steps described above may be replaced or eliminated in accordance with various embodiments of the method 260.

In one or more of the embodiments discussed above, the tunnel layer (e.g., the TB layer 314) is described as being formed at a drain end 312 of the device (e.g., the device 300). However, in some embodiments, it may be advantageous to form the tunnel layer at a source end (e.g., the source end 311) of the device. For example, at least parts of the method 220 may be implemented to fabricate a device which includes the TB layer 314 formed at the source end 311. With reference to FIGS. 12A-12D, illustrated therein are schematic views of various single and/or multi-gate transistors which include the TB layer 314 at the source end 311 of the device. For clarity of discussion, a substrate (e.g., the substrate 302) is not shown in the figures; however, a set of reference axes (X, Y, Z) provided in FIG. 12E illustrate the orientation of the devices schematically depicted in FIGS. 12A-12D. Referring now to FIG. 12A, a single-gate device 1202 is shown. In some embodiments, the device 1202 includes the gate stack 910 and may fabricated in a manner substantially equivalent to that used to fabricate the device 300, as shown and described with reference to FIGS. 3-8, except that the TB layer 314 for the device 1202 is formed between the channel region 304 and the source region 306. Referring to FIG. 12B, there is illustrated a double-gate device 1204. In various embodiments, the double-gate device 1204 includes the gate stack 910 and the gate stack 912, having the channel region 304 and the TB layer 314 disposed therebetween, with the TB layer formed at the source end 311. Referring to FIG. 12C, there is illustrated a multi-gate device 1206. In some embodiments, the multi-gate device 1206 includes the gate stack 914 formed around three sides of the channel region 304 and the TB layer 314, with the TB layer formed at the source end 311. In some embodiments, the multi-gate device 1206 includes a tri-gate device, a FinFET device, an Omega-gate (Ω-gate) device, or a Pi-gate (Π-gate) device. In some embodiments, for example when the multi-gate device 1206 includes a FinFET device, the channel region 304 and the TB layer 314 may be integrated within a fin structure, and the source/drain regions 306, 308 may be formed in, on, or around the fin structure and on either side of the channel region 304 and the TB layer 314, as schematically shown in FIG. 12C. Referring to FIG. 12D, there is illustrated a GAA device 1208. In some embodiments, the GAA device 1208 includes the gate stack 916 which surrounds the channel region 304 and the TB layer 314, with the TB layer formed at the source end 311.

In at least some embodiments of the method 240, the method 240 may also be used to fabricate a vertically-oriented single- or multi-gate device which includes the tunnel barrier layer formed at the source end (e.g., the source end 311). With reference to block 244 of the method 240, the ordinal position of the channel region 304 and the TB layer 314 (e.g., which form the tunnel barrier/channel stack), are transposed as compared to the embodiments shown in FIGS. 10A-10D. Referring to FIGS. 13A-13D, illustrated therein are schematic views of various single and/or multi-gate transistors which include the TB layer 314 at the source end 311. For clarity of discussion, a substrate (e.g., the substrate 302) is not shown in the figures; however, a set of reference axes (X, Y, Z) provided in FIG. 13E illustrates the vertical orientation (substantially along the Y-axis) of the devices schematically depicted in FIGS. 13A-13D, where the substrate is oriented in a substantially horizontal direction. In some embodiments, the devices shown in FIGS. 13A-13D are vertically-oriented analogues of the devices shown in FIGS. 12A-12D. Thus, with reference to FIG. 13A, a vertically-oriented single-gate device 1302 is shown, with the TB layer 314 formed at the source end 311. With reference to FIG. 13B, there is illustrated a vertically-oriented double-gate device 1304, with the TB layer 314 formed at the source end 311. With reference to FIG. 13C, there is illustrated a vertically-oriented multi-gate device 1306, with the TB layer 314 formed at the source end 311, and where the vertically-oriented multi-gate device 1306 may include a tri-gate device, a FinFET device, an Omega-gate (Ω-gate) device, or a Pi-gate (Π-gate) device. With reference to FIG. 13D, there is illustrated a gate-all-around (GAA) device 1008, with the TB layer 314 formed at the source end 311.

Figure 14:
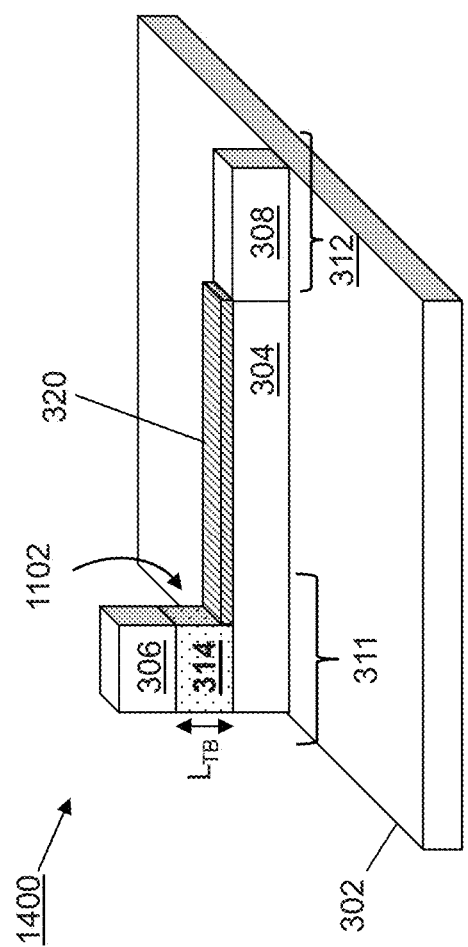
FIG. 14 is a schematic view of a device, with a tunnel barrier at a source end, fabricated according to one or more steps of the methods of FIGS. 2A and 2D.

In at least some embodiments of the method 260, the method 260 may also be used to form the TB 314 at the source end 311, where the TB layer 314 is disposed over an end of the high-mobility channel. Referring to the example of FIG. 14, illustrated is a semiconductor device 1400 including a semiconductor substrate 302, a channel region 304 and a source region 306. In an embodiment of the block 264 of the method 260, and with reference to FIG. 14, the TB layer 314 is formed over the source end 312 of the device 1400. In an embodiment of the block 266 of the method 260, and with reference to FIG. 14, the source region 306 is directly formed over the TB layer 314. Thus, the TB layer 314 of FIG. 14 is disposed between the channel region 304 and the source region 306, and the TB layer 314 is within the source-to-drain current path. In addition, and as described above, the TB layer 314 may include a material having a different composition, and thus a different bandgap, than a composition of either of the channel region 304 or the source region 306, providing for suppressed and/or significantly decreased BTBT current. In an embodiment of the block 268 of the method 260, the gate stack 320 is formed. In some embodiments, the high-K/metal gate stack 320 illustrated in FIG. 14 may not overlap the TB layer 314. In some cases, the high-K/metal gate stack 320 may also be formed along a sidewall 1102 of the TB layer 314, for example, to provide electrostatic gate modulation of the barrier height of the TB layer 314.

Figures 15, 16:
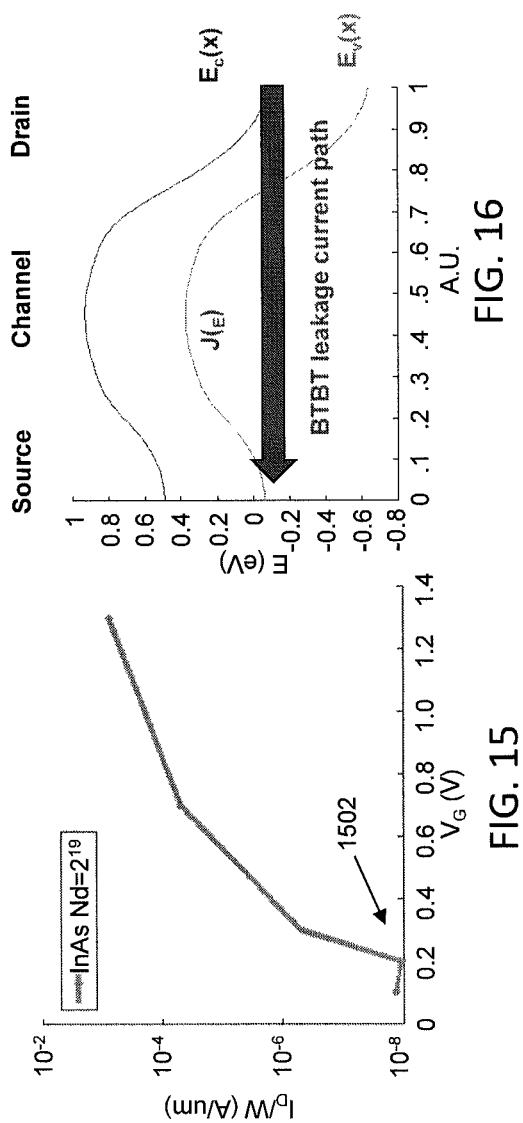
FIG. 15 is an illustrative drain current versus voltage plot for a device without a tunnel barrier.
FIG. 16 is an illustrative energy band diagram for an N-type FinFET device having the electrical characteristics of FIG. 15.

For purposes of illustration, FIG. 15 shows an example of the high BTBT current that may flow in the subthreshold regime for a device without a tunnel barrier (e.g., such as the TB layer 314). In particular, FIG. 15 illustrates a normalized drain current ($I_D/W$) versus gate voltage ($V_G$) for an N-type FinFET device including an InAs channel. Merely for purposes of discussion, parameters for the exemplary FinFET device include a fin width of about 5.4 nm, a channel length of about 15 nm, and an applied drain-to-source voltage of about 0.6 V. In the example of FIG. 15, the current value in the subthreshold region, indicated by arrow 1502, reaches a minimum value of about $1 \times 10^{-8}$ A/μm, where the minimum leakage current is largely determined by the BTBT current limit. For further illustration, FIG. 16 shows an energy band diagram, between the source and drain regions, for the N-type FinFET device having the electrical characteristics of FIG. 15 and biased as described above. The illustrative energy band diagram of FIG. 16 includes a conduction band ($E_C$) and a valence band ($E_V$). In the subthreshold region, and without a tunnel barrier (e.g., such as the TB layer 314), a large BTBT current is present, for example, due to electrons in the conduction band of the drain that tunnel directly to the valence band of the channel region and to the source.

Figure 17:
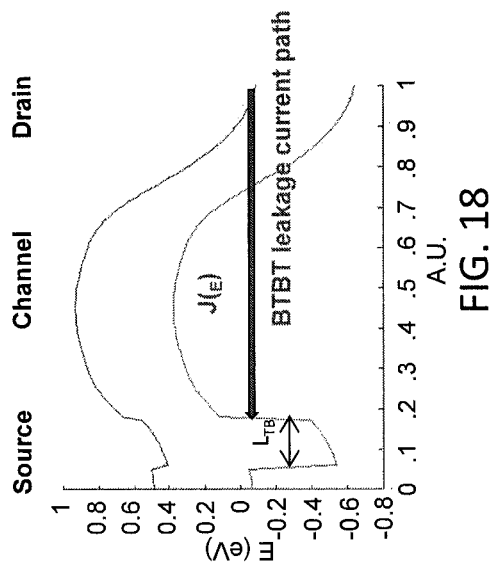
FIG. 17 is an illustrative energy band diagram for the N-type FinFET of FIG. 15, including a tunnel barrier layer formed at a drain end of the device.

Thus, considering a BTBT current limit of about $1 \times 10^{-8}$ A/μm, such a FinFET device could only be used in HP devices, which have an industry standard leakage current limit of about 100 nA/μm. However, such a device could not be used for LOP devices, having a limit of about 5 nA/μm, or for LSTP devices, with a limit of about 10 pA/μm. In the embodiments described herein, suppression of the BTBT current is possible, for example, by formation of a tunnel barrier layer, according to one or more of the methods described above, which forms a band-offset at a channel/source or channel/drain heterojunction interface. For example, consider a tunnel barrier layer formed at a drain end of a device (e.g., the N-type FinFET device having the electrical characteristics of FIG. 15) using one of the methods described above. For purposes of illustration, FIG. 17 shows how the energy band diagram changes, for example as compared to FIG. 16, for the N-type FinFET described above upon formation of a TB layer. As shown, insertion of the TB layer creates a band-offset at the drain-channel interface, and increases a tunneling distance for conduction band (drain) to valence band (channel) tunneling, thus significantly reducing the BTBT current. In various embodiments reduction of the BTBT current may be modulated by one or more of the TB layer thickness, material composition of the TB layer (which defines the band-offset), and the gate overlap of the TB layer (for electrostatic modulation, as described above). Thus, in some embodiments, where the TB layer is formed at the drain end, the TB layer may include a conduction band-offset (e.g., for N-type devices) or a valence band-offset (e.g., for P-type devices), such as to create a tunnel barrier with respect to the drain-channel interface in the conduction band or valence band, respectively.

Figure 18:
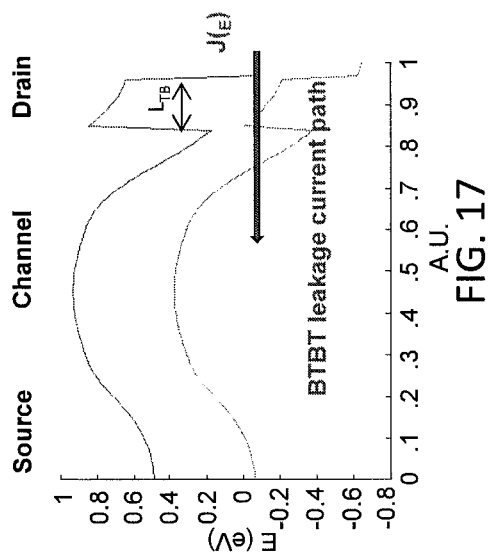
FIG. 18 is an illustrative energy band diagram for the N-type FinFET of FIG. 15, including a tunnel barrier layer formed at a source end of the device.

As described above with reference to FIGS. 12A-12D, 13A-13D, and 14, the TB layer may, in some embodiments, be formed at a source end 311 of the device. For purposes of illustration, FIG. 18 shows energy band diagram, for example for the N-type FinFET described above, but where the TB layer is formed at the source end of the device. As shown, insertion of the TB layer creates a band-offset at the source-channel interface, where the band-offset increases a hole barrier. Without the TB layer at the drain-channel interface, tunneling from the conduction band at the drain, to the valence band in the channel, may still occur. However, the increased hole barrier provided by the TB layer at the source end of the device may block BTBT current from reaching the source region. Thus, in some embodiments, where the TB layer is formed at the source end, the TB layer may include a valence band-offset (e.g., for N-type devices) or conduction band-offset (e.g., for P-type devices), such as to create a tunnel barrier with respect to the source-channel interface in the valence or conduction band, respectively. Ideally, in some embodiments, the TB layer additionally presents a very small band-offset (or even a negative band offset) with respect to the other band (i.e., conduction band for N-type devices and valence band for P-type devices) so that there is a very small, or negligible, barrier in the current path during the ON-state of the device.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and systems for suppressing leakage current in devices having high-mobility channel materials. In some embodiments, a TB layer is formed at the drain side of a device, the device having a high-mobility channel material, in order to suppress and/or significantly decrease the BTBT current. In other examples, a TB layer is formed at the source side of a device to suppress such BTBT current. In various embodiments, the channel region is formed of a material having a different composition (including a different bandgap) than a composition of the TB layer. Thus, a heterojunction is formed at a source side or a drain side of the device, providing for suppressed and/or significantly decreased BTBT current. In some examples, a gate stack is formed which at least partially overlaps the TB layer, for example, to provide electrostatic control of the barrier height of the TB layer.

Thus, one of the embodiments of the present disclosure described a semiconductor device including a source region, a drain region, and a channel region. In various embodiments, the channel region is adjacent to and in contact with one of the source region and the drain region. In some examples, a tunnel barrier layer is interposed between, and in contact with, the channel region and the other one of the source region and the drain region. A gate stack may be formed over at least the channel region. In various examples, the tunnel barrier layer includes a first material, and the channel region includes a second material different than the first material. In some embodiments, the semiconductor device may be oriented in one of a horizontal or vertical direction. Additionally, each of the first and second materials may include one of Si, SiGe, strained Ge, Ge, GaAs, GaSb, GaP, InP, InAs, AlSb, InSb, GaAsP, InAlAs, AlGaAs, InGaAs, GaInP, and GaInAsP. Furthermore, in some embodiments, the semiconductor device may include one of a single-gate device, a double-gate device, a tri-gate device, a FinFET device, an Omega-gate (Ω-gate) device, a Pi-gate (Π-gate) device, and a gate-all-around (GAA) device.

In another of the embodiments, discussed is an integrated circuit including a first semiconductor device. The first semiconductor device may include a gate stack, and a source and drain region adjacent to the gate stack. A channel region is interposed between the source and drain regions, and the gate stack is disposed on the channel region. In some examples, a tunnel barrier interposes the channel region and one of the source region and the drain region. By way of example, a first heterojunction is formed at an interface of the tunnel barrier and the channel region, and a second heterojunction is formed at an interface of the tunnel barrier and at least one of the drain region and the source region. In some embodiments, the integrated circuit further includes a second semiconductor device and a third semiconductor device. In some cases, the first semiconductor device includes a high performance device, the second semiconductor device includes a low operating power device, and the third semiconductor device includes a low standby power device.

In yet another of the embodiments, discussed is a method for fabricating a semiconductor device configured to suppress BTBT current in devices having a high-mobility channel material. In some embodiments, the method includes forming a channel region adjacent to and in contact with one of a source region and a drain region. A tunnel barrier layer may be formed such that the tunnel barrier layer is interposed between, and in contact with, the channel region and one of the source region and the drain region. In some embodiments, a gate stack is then formed over at least the channel region. In various examples, the tunnel barrier layer includes a first material, and the channel region includes a second material different than the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a source region and a drain region;
 a channel region having a first side surface, a second side surface opposite the first side surface, and a top surface disposed between and sharing a border with each of the first and second side surfaces, wherein the first side surface is adjacent to and in contact with one of the source region and the drain region at a first end of the channel region;
 a tunnel barrier layer disposed on and in contact with the top surface at a second end of the channel region, and the other one of the source region and the drain region formed over the tunnel barrier layer; and
 a gate stack formed over at least a portion of the top surface of the channel region;

wherein the tunnel barrier layer includes a first material, and wherein the channel region includes a second material different than the first material.

2. The semiconductor device of claim 1, wherein the first side surface is adjacent to and in contact with the source region at the first end of the channel region.

3. The semiconductor device of claim 2, wherein the tunnel barrier layer is disposed on and in contact with the top surface at the second end of the channel region and the drain region is formed over the tunnel barrier layer.

4. The semiconductor device of claim 1, wherein the gate stack is formed over at least the portion of the top surface of the channel region and at least a portion of a sidewall of the tunnel barrier layer.

5. The semiconductor device of claim 1, wherein the first side surface is adjacent to and in contact with the drain region at the first end of the channel region.

6. The semiconductor device of claim 5, wherein the tunnel barrier layer is disposed on and in contact with the top surface at the second end of the channel region and the source region is formed over the tunnel barrier layer.

7. The semiconductor device of claim 1, wherein the semiconductor device is oriented in a substantially horizontal direction.

8. The semiconductor device of claim 1, wherein the semiconductor device is oriented in a substantially vertical direction.

9. The semiconductor device of claim 1, wherein each of the first and second materials include one of Si, SiGe, strained Ge, Ge, GaAs, GaSb, GaP, InP, InAs, AlSb, InSb, GaAsP, InAlAs, AlGaAs, InGaAs, GaInP, and GaInAsP.

10. The semiconductor device of claim 1, wherein semiconductor device includes one of a single-gate device, a double-gate device, a tri-gate device, a FinFET device, an Omega-gate (Ω-gate) device, a Pi-gate (Π-gate) device, and a gate-all-around (GAA) device.

11. An integrated circuit, comprising:
a first semiconductor device including:
a gate stack;
a source region and a drain region adjacent to and on either side of the gate stack;
a channel region interposing the source and drain regions and adjacent to and in contact with the source region at a first end of the channel region, wherein the gate stack is disposed on the channel region; and
a tunnel barrier interposing, and in contact with, each of a second end of the channel region and the drain region;
wherein a first heterojunction is formed at an interface of the tunnel barrier and the channel region, wherein a second heterojunction is formed at an interface of the tunnel barrier and the drain region, wherein the first and second heterojunctions each form an energy band offset in at least one of a valence band and a conduction band, and wherein the energy band offset increases an energy barrier between the channel region and the drain region.

12. The integrated circuit of claim 11, wherein the channel region has a first side surface, a second side surface opposite the first side surface, and a top surface disposed between and sharing a border with each of the first and second side surfaces, wherein the first side surface is adjacent to and in contact with the source region, wherein the tunnel barrier layer is disposed on and in contact with the top surface at the second end of the channel region, and wherein the drain region is disposed over the tunnel barrier layer.

13. The integrated circuit of claim 11, wherein the gate stack is formed over the channel region and at least a portion of the tunnel barrier.

14. The integrated circuit of claim 11, wherein each of the first and second materials include one of Si, SiGe, strained Ge, Ge, GaAs, GaSb, GaP, InP, InAs, AlSb, InSb, GaAsP, InAlAs, AlGaAs, InGaAs, GaInP, and GaInAsP.

15. The integrated circuit of claim 11, further comprising:
a second semiconductor device; and
a third semiconductor device;
wherein the first semiconductor device includes a high performance device, wherein the second semiconductor device includes a low operating power device, and wherein the third semiconductor device includes a low standby power device.

16. A method of semiconductor device fabrication, comprising:
forming a channel region adjacent to and in contact with a source region at a first end of the channel region;
forming a tunnel barrier layer interposed between, and in contact with, each of a second end of the channel region and a drain region; and
after forming the tunnel barrier layer, forming a gate stack over at least a portion of the channel region;
wherein the tunnel barrier layer includes a first material, and wherein the channel region includes a second material different than the first material, and wherein the tunnel barrier layer increases an energy barrier between the channel region and the drain region.

17. The method of claim 16,
wherein the forming the channel region includes forming the channel region including a first side surface, a second side surface opposite the first side surface, and a top surface disposed between and sharing a border with each of the first and second side surfaces, wherein the first side surface is adjacent to and in contact with the source region at the first end of the channel region, and wherein forming the tunnel barrier layer includes forming the tunnel barrier layer disposed on and in contact with the top surface at the second end of the channel region; and
forming the drain region over the tunnel barrier layer.

18. The method of claim 17, wherein the forming the gate stack further includes forming the gate stack over at least a portion of a sidewall of the tunnel barrier layer.

19. The method of claim 16, further comprising:
prior to forming the tunnel barrier layer, patterning and etching the second end of the channel region to form a tunnel barrier region including a recess; and
epitaxially depositing the first material within the recess to form the tunnel barrier layer.

* * * * *